United States Patent
Fujii et al.

(10) Patent No.: US 9,190,544 B2
(45) Date of Patent: Nov. 17, 2015

(54) PHOTODIODE, OPTICAL SENSOR DEVICE, AND PHOTODIODE MANUFACTURING METHOD

(75) Inventors: Kei Fujii, Itami (JP); Takashi Ishizuka, Itami (JP); Katsushi Akita, Itami (JP); Yasuhiro Iguchi, Osaka (JP); Hiroshi Inada, Osaka (JP); Youichi Nagai, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 312 days.

(21) Appl. No.: 13/581,863

(22) PCT Filed: Sep. 28, 2011

(86) PCT No.: PCT/JP2011/072251
§ 371 (c)(1),
(2), (4) Date: Aug. 30, 2012

(87) PCT Pub. No.: WO2012/046603
PCT Pub. Date: Apr. 12, 2012

(65) Prior Publication Data
US 2013/0032780 A1  Feb. 7, 2013

(30) Foreign Application Priority Data
Oct. 6, 2010  (JP) .................................. 2010-226932

(51) Int. Cl.
*H01L 31/0352* (2006.01)
*B82Y 20/00* (2011.01)
(Continued)

(52) U.S. Cl.
CPC ......... *H01L 31/035236* (2013.01); *B82Y 20/00* (2013.01); *H01L 27/1464* (2013.01);
(Continued)

(58) Field of Classification Search
CPC ................... H01L 31/035236; H01L 31/1844; H01L 27/14647; H01L 27/14652; H01L 29/15; Y02E 10/544

USPC ...................... 257/14, 97, E31.033, E27.135, 257/E27.138; 438/94
See application file for complete search history.

(56) References Cited

U.S. PATENT DOCUMENTS

2003/0155625 A1   8/2003  Kato et al.
2007/0020933 A1*  1/2007  Naniwae ....................... 438/689
(Continued)

FOREIGN PATENT DOCUMENTS

CN   1487601 A    4/2004
JP   1-205477     8/1989
(Continued)

OTHER PUBLICATIONS

English machine translation of JP06-196745A to Oikawa of record.*
(Continued)

*Primary Examiner* — Tom Thomas
*Assistant Examiner* — Christopher M Roland
(74) *Attorney, Agent, or Firm* — Drinker Biddle & Reath LLP

(57) ABSTRACT

A photodiode and the like capable of preventing the responsivity on the short wavelength side from deteriorating while totally improving the responsivity in a type II MQW structure, is provided. The photodiode is formed on a group III-V compound semiconductor substrate, and includes a pixel. The photodiode includes an absorption layer of a type II MQW structure, which is located on the substrate. The MQW structure includes fifty or more pairs of two different types of group III-V compound semiconductor layers. The thickness of one of the two different types of group III-V compound semiconductor layers, which layer has a higher potential of a valence band, is thinner than the thickness of the other layer.

12 Claims, 9 Drawing Sheets

(51) Int. Cl.
*H01L 31/105* (2006.01)
*H01L 31/18* (2006.01)
*H01L 27/146* (2006.01)
*H01L 29/15* (2006.01)

(52) U.S. Cl.
CPC .......... *H01L31/105* (2013.01); *H01L 31/1844* (2013.01); *H01L 31/1852* (2013.01); *H01L 27/14634* (2013.01); *H01L 27/14636* (2013.01); *H01L 27/14647* (2013.01); *H01L 27/14652* (2013.01); *H01L 29/15* (2013.01); *Y02E 10/544* (2013.01)

(56) References Cited

U.S. PATENT DOCUMENTS

| | | | |
|---|---|---|---|
| 2008/0083919 A1* | 4/2008 | Takahashi et al. | 257/13 |
| 2009/0008648 A1 | 1/2009 | Biwa et al. | |
| 2010/0051905 A1 | 3/2010 | Iguchi et al. | |
| 2010/0072457 A1 | 3/2010 | Iguchi et al. | |

FOREIGN PATENT DOCUMENTS

| | | |
|---|---|---|
| JP | 6-196745 | 7/1994 |
| JP | 2004-207588 A | 7/2004 |
| JP | 2005-116567 | 4/2005 |
| JP | 2009-206499 | 9/2009 |
| WO | WO 2009/014076 A1 | 1/2009 |

OTHER PUBLICATIONS

English machine translation of JP2009-206499A to Inoguchi et al. of record.*

Rubin Sidhu et al., "A Long-Wavelength Photodiode on InP Using Lattice-Matched GaInAs—GaAsSb Type-II Quantum Wells," IEEE Photonics Technology Letters, Dec. 2005, pp. 2715-2717, vol. 17, No. 12.

R. Sidhu et al., A 2.3 μm Cutoff Wavelength Photodiode on InP Using Lattice-Matched GaInAs-GaAsSb Type-II Quantum Wells, International Conference on Indium Phosphide and Related Materials, 2005, pp. 148-151.

Satoru Fujii et al., "MOVPE Seicho shita InGaAs/ GaAsSb Type II Ryoshi Ido o Mochiita 2.5μm-Tai Photodiode," Dai 70 Kai The Japan Society of Applied Physics Gakujutsu Koenkai Koen Yokoshu, 2009, p. 301, vol. 1, including partial English translation.

Horita, M., et al., "Metalorganic Vapor Phase Epitaxy Growth of InGaAsP Multi Quantum Well Laser Diodes using Entirely Organic Sources," Journal of Crystal Growth 145, pp. 886-891, 1994.

* cited by examiner

PHOTODIODE, OPTICAL SENSOR DEVICE, AND PHOTODIODE MANUFACTURING METHOD

TECHNICAL FIELD

The present invention relates to a group III-V compound semiconductor photodiode, an optical sensor device, and a method of manufacturing the photodiode. More particularly, the invention relates to: a photodiode in which an absorption layer includes a type II multiple quantum well (hereinafter, referred to as "MQW") structure having responsivity up to a long wavelength region of the near-infrared; an optical sensor device adopting the photodiode; and a method of manufacturing the photodiode.

BACKGROUND ART

Non-Patent Literature 1 discloses a photodiode in which, on an InP substrate as a group III-V compound semiconductor substrate, an InGaAs/GaAsSb type II MQW structure which lattice-matches with the InP substrate is formed as an absorption layer. This MQW structure comprises 150 repetitions (150 pairs) of 5 nm thick InGaAs and 5 nm thick GaAsSb. In the photodiode disclosed in Non-Patent Literature 1, a cut-off wavelength of about 2.39 µm is achieved.

The above photodiode has a structure in which a cap layer located on the side opposite to the InP substrate with respect to the absorption layer has p-type conductivity while the InP substrate has n-type conductivity, and light is incident on the rear surface of the InP substrate.

Meanwhile, Non-Patent Literature 2 discloses wavelength dependence of responsivity of a photodiode having the same structure as above. The responsivity is not flat with respect to the wavelength, but exhibits strong wavelength dependence.

CITATION LIST

Non Patent Literature

[NON PATENT LITERATURE 1] R. Sidhu, et. al. "A Long-Wavelength Photodiode on InP Using Lattice-Matched GaInAs-GaAsSb Type-II Quantum Wells, IEEE Photonics Technology Letters, Vol. 17, No. 12 (2005), pp. 2715 to 2717

[NON PATENT LITERATURE 2] R. Sidhu, et. al. "A 2.3 µm CUTOFF WAVELENGTH PHOTODIODE ON InP USING LATTICE-MATCHED GaInAs—GaAsSb TYPE-II QUANTUM WELLS", International Conference on Indium Phosphide and Related Materials (2005), pp. 148-151

SUMMARY OF THE INVENTION

Problems to be Solved by the Invention

The responsivity of the photodiode having the type II InGaAs (5 nm thick)/GaAsSb (5 nm thick) MQW structure is relatively high on the long wavelength side near 2.3 µm, but significantly drops at a wavelength near 1.5 µm. This drop in responsivity at the wavelength near 1.5 µm is undesirable in spectral analysis or the like. The responsivity is desired to be flat over the entire wavelength region. However, the responsivity is not desired to be stable at a low level. The responsivity is desired to be at or higher than a predetermined level, but flat with respect to the wavelength. Even if the responsivity varies, the variation should be gentle.

An object of the present invention is to provide: a photodiode having a type II MQW structure, which can improve responsivity over the entire absorbable wavelength region, and prevent reduction in responsivity in a short wavelength region; an optical sensor device adopting the photodiode; and a method of manufacturing the photodiode. Note that the photodiode may be a single-pixel photodiode, or a photodiode array in which a plurality of pixels are one-dimensionally or two-dimensionally arrayed.

Solution to the Problems

A photodiode according to the present invention is formed on a group III-V compound semiconductor substrate, and includes a pixel. This photodiode includes an absorption layer of a type II MQW structure, which is located on the substrate. The MQW structure includes fifty or more pairs of two different types of group III-V compound semiconductor layers. The thickness of one of the two different types of group III-V compound semiconductor layers, which layer has a higher potential of a valence band than the other layer, is thinner than the thickness of the other layer.

Generally, when light absorption occurs in an absorption layer, electrons in the valence band are excited up to the conduction band, and holes are generated in the valence band. That is, pairs of electrons and holes are formed by the light absorption. In order to detect that the light absorption has occurred in a predetermined pixel, the electrons and the holes need to reach an n-side electrode and a p-side electrode, respectively, to be detected as electric charge or current. Either of the n-side electrode and the p-side electrode needs to be provided for each pixel.

The electrons move through the conduction band to reach the n-side electrode while the holes move through the valence band to reach the p-side electrode, and thereby the charge or current is detected. When the moving speed of each carrier (electrons or holes) is to be estimated, the effective mass of the carrier greatly influences the estimation, as described hereinafter. The effective mass of electrons in the conduction band in a compound semiconductor is about 0.05 m (m: effective mass of free electrons), whereas the effective mass of holes (heavier holes) in the valence band is, for example, about ten times or more greater than that of electrons.

The following is a phenomenon unique to light absorption in a type II MQW structure. That is, in light absorption on the long wavelength side in the type II MQW structure, holes are generated in a layer having a higher valence band (hereinafter referred to as "higher-valence-band layer"). The valence band of a neighboring layer (a layer having a lower valence band (hereinafter referred to as "lower-valence-band layer")) forms a well-type barrier against the valence band of the higher-valence-band layer. Therefore, movement of the holes caused by the light absorption is prevented by the potential barrier caused by the neighboring lower-valence-band layer, in addition to that the effective mass of the holes is significantly greater than that of the electrons as described above.

In the type II MQW structure, absorption of light on the long wavelength side occurs at an interface between the higher-valence-band layer and the lower-valence-band layer. The electrons in the valence band in the higher-valence-band layer are excited up to the conduction band in the lower-valence-band layer, due to absorption of light having a smaller energy (light having a longer wavelength). This is the reason why the type II MQW structure is used in order to extend the responsivity toward the longer wavelength side. Therefore, in the type II MQW structure, the responsivity in the long wavelength region cannot be improved to the practical level unless the MQW structure includes a predetermined number or more of pairs (number of interfaces). However, if the number of pairs is too large, the total thickness of the MQW structure becomes excessively large, and the thick MQW structure prevents the holes from reaching the p-side electrode, resulting in reduction in responsivity. This is because the holes disappear while moving in the MQW structure, and cannot reach the p-side electrode. In the present invention, the number of pairs is 50 or more. Although an upper limit is not specifically given, the number of pairs is preferably not larger than 700 so that the thickness of the MQW structure does not become a major factor for disappearance of holes.

Although the following two configurations (F1) and (F2) cover all configurations of photodiodes, the configurations are classified for organization of thoughts. The present invention has beneficial effects on the both configurations.

(F1) In a positional relationship in which an MQW structure is sandwiched between an incident surface and a p-side electrode, there is a strong tendency that light on the short wavelength side is absorbed at an end of the MQW structure near the incident surface. Therefore, holes, of generated holes and electrons, cannot reach the p-side electrode unless moving through almost the entire thickness of the MQW structure. The holes are highly likely to disappear during moving in the MQW structure, resulting in reduction in responsivity. There is a tendency that light of a shorter wavelength is absorbed at a position farther from the p-side electrode in the MQW structure, and causes holes. Therefore, reduction in responsivity due to disappearance of holes during moving is more likely to occur on the short wavelength side.

(F2) In a positional relationship in which an MQW structure is sandwiched between an incident surface and an n-side electrode, a p-side electrode, having no MQW structure between itself and the incident surface, is located near the incident surface. Electrons in the conduction band which are caused by light absorption cannot reach the n-side electrode unless moving through almost the entire thickness of the MQW structure. Although the electrons have to move through almost the entire MQW layers, since the effective mass of the electrons is about ten times as small as that of the holes, the electrons can easily move in the MQW structure. Therefore, influence on reduction in responsivity is not very great. However, if light absorption occurs not at an end of the MQW structure but in the vicinity of the center of the MQW structure in the thickness direction, holes generated there cannot reach the p-side electrode unless moving through the many MQW layers, which still causes reduction in responsivity.

In the configuration of (F2), influence on reduction in responsivity in the short wavelength region seems to be not very great as compared with the configuration of (F1). Even so, reduction in responsivity due to disappearance of holes during moving in the MQW structure surely occurs, and cannot be ignored.

In both the configurations of (F1) and (F2), if the thickness of the higher-valence-band layer is reduced while maintaining 50 pairs or more, the following effects (e1) to (e3) can be obtained. Note that, in the following description, a wavelength limit means a limit on the long wavelength side.

(e1) A limit of absorbable wavelength in the type II MQW structure is determined by a difference between the energy of the ground state in the valence band in the higher-valence-band layer and the energy of the ground state in the conduction band of the lower-valence-band layer. Generally, when the thickness of a quantum well layer is reduced, the energy of the ground state for electrons significantly increases, whereas the energy of the ground state for holes does not increase very much. The reason is as follows. The effective mass greatly influences the energy level of electrons or holes. That is, the greater the effective mass, the lower the energy level of electrons and holes, and the lower the energy level of the ground state. By reducing the thickness of the higher-valence-band layer (in which holes are generated in the valence band), and maintaining the thickness of the lower-valence-band layer (in which electrons are generated in the conduction band) at a predetermined level or higher, the limit of absorbable wavelength remains almost unchanged.

Regarding the responsivity in the wavelength region including the wavelength limit, it is possible to maintain high responsivity by providing an MQW structure including 50 or more pairs.

(e2) In an absorption stand-by state, a reverse bias voltage is applied between the p-side electrode and the n-side electrode to create an electric field in the MQW structure. Holes and electrons are driven by this electric field, and move in the MQW structure. By reducing the total thickness of the MQW structure as in the present invention, the intensity of the electric field caused in the MQW structure by the constant bias voltage can be increased. This increase in the intensity of the electric field suppresses disappearance of holes, thereby improving the responsivity.

(e3) The above-described effect of suppressing disappearance of holes is effective regardless of the wavelength of the absorbed light. By reducing the total thickness of the MQW structure while securing a predetermined number or more of pairs, disappearance of holes in the MQW structure as described in the above (F1) can be reduced, thereby avoiding reduction in responsivity particularly on the short wavelength side. As a result, the responsivity is flat or varies gently with respect to the wavelength.

The thickness of the layer having the higher potential of the valence band may be 1 nm or more thinner than the thickness of the other layer. Thereby, the total thickness of the MQW structure can be reliably reduced while securing a predetermined number or more of pairs. As a result, the responsivity can be improved over the entire wavelength region at and below the wavelength limit. In particular, it is possible to improve the responsivity of light in the short wavelength region, which is likely to be absorbed at an end position far from the p-side electrode in the case of the above (F1).

The photodiode includes a cap layer located on the absorption layer. A region of the pixel in the cap layer has p-type conductivity, and a rear surface of the substrate is a light incident surface. In this case, the p-side electrode is located on the pixel of the p-type conductivity. Holes caused by light absorption are likely to disappear while moving in the valence band toward the p-side electrode. As a result, the responsivity is reduced. Particularly when light absorption occurs at an end of the MQW structure near the substrate, holes generated there do not contribute to the responsivity unless moving through almost the entire thickness of the MQW structure. In the present invention, as described above, it is possible to reduce the total thickness of the MQW structure without greatly affecting the limit of absorbable wavelength. As a result, it is possible to improve the responsivity of light on the short wavelength side which is highly likely to be absorbed at the end of the MQW structure.

When adopting an InP substrate, it is general that light is incident on the rear surface of the substrate, for the following two reasons: easiness in handling Zn as a p-type impurity for which a lot of technical knowledge has been accumulated; and easiness in arranging a readout IC (ROIC) for an electrode of a pixel. Therefore, the above-described configuration is adopted in many cases. Specifically, the configuration of the above (F1) is adopted in many cases. In this case, the n-side electrode is a ground electrode.

The photodiode includes a cap layer located on the absorption layer. A region of the pixel in the cap layer has n-type conductivity, and light is incident on the cap layer. In this case, the p-side electrode is a ground electrode. The incident light is usually absorbed as soon as it enters the MQW structure. Therefore, holes cannot contribute to the responsivity unless moving through almost the entire thickness of the MQW structure to reach the p-side electrode. Particularly, light on the short wavelength side is likely to be absorbed as soon as it enters the MQW structure, and therefore, is more likely not to contribute to the responsivity. In the present invention, however, the total thickness of the MQW structure is reduced while maintaining the responsivity on the long wavelength side, without greatly affecting the limit of absorbable wavelength. Therefore, the frequency of disappearance of the holes during moving in the MQW structure can be reduced to maintain responsivity. In particular, the present invention is effective in preventing reduction in responsivity on the short wavelength side.

An InP substrate may be adopted. Thereby, it is possible to realize a photodiode having excellent crystallinity and reduced dark current, and having responsivity in the near infrared region, by using an InP substrate that has been frequently used.

The layer having the higher potential of the valence band may include Ga, As, and Sb. Thereby, it is possible to form a layer of a group III-V compound semiconductor, such as GaAsSb, GaAsSbN, or GaAsSbP, in which the potential of the valence band is high. Particularly when using an InP substrate, excellent lattice-matching is achieved, thereby realizing a high-definition photodiode with reduced dark current.

The MQW structure may be a type II MQW structure composed of pairs of $In_xGa_{1-x}As$ ($0.38 \leq x \leq 0.68$) and $GaAs_ySb_{1-y}$ ($0.36 \leq y \leq 0.62$).

Thereby, it is possible to realize a high-definition photodiode having a limit of absorbable wavelength not lower than 2.5 µm, and can cover a range up to near 3 µm.

The responsivity of the photodiode to light having a wavelength of 1500 nm can be 0.5 A/W or more.

Thereby, it is possible to avoid the situation that poor responsivity on the short wavelength side adversely affects information processing or the like, such as spectral analysis.

It is desirable that there is no regrown interface between an upper surface of the MQW structure and a bottom surface of the cap layer.

Impurities such as oxygen and carbon are concentrated on a regrown interface, and cause degradation of crystallinity of an epitaxial layer formed on the regrown interface, leading to increased dark current or the like. Since no regrown interface is formed at the above position, an excellent crystal layer is obtained, and dark current is reduced.

An optical sensor device of the present invention adopts any of the above-described photodiodes.

Thus, by using a high-definition photodiode with reduced dark current, having responsivity in the near infrared region, it is possible to provide a compact optical sensor device that can be used at room temperature, in the fields such as organism and environment in which it has been impossible to perform sensing without using a cooling system. If a cooling system is needed, a power source for the cooling system or a supply of liquid nitrogen or the like are also needed. Such a cooling system imposes a considerable limitation on the size of the device, preservation of cooling, cost for preservation of cooling, and the like. The present invention enables highly-accurate sensing in the fields where it has been impossible to perform sensing for the above reasons.

A photodiode manufacturing method of the present invention manufactures a photodiode which is formed on a group III-V compound semiconductor substrate, and includes a pixel. This method includes a step of growing an absorption layer of a type II MQW structure on the substrate. In the type II MQW structure, a first group III-V compound semiconductor layer and a second group III-V compound semiconductor layer are paired, and the potential of a valence band of the first layer is higher than the potential of a valence band of the second layer. In the MQW growing step, the thickness of the first layer is made thinner than the thickness of the second layer, and fifty or more pairs of the first and second layers are deposited.

By the above method, it is possible to easily manufacture a photodiode having high responsivity, without greatly varying the limit of absorbable wavelength.

The photodiode manufacturing method further includes a step of forming layers including group III-V compound semiconductors, after the MQW growing step. Growth is performed in a growth chamber by all metal-organic source MOVPE, from the start of the growth of the MQW structure to the end of the growth of the layers including group III-V compound semiconductors, so that a step of forming a regrown interface is not included between the MQW growing step and the step of forming the layers including group III-V compound semiconductors.

Thereby, it is possible to form a layered structure with excellent crystallinity on the MQW structure.

Advantageous Effects of the Invention

According to a semiconductor device and the like of the present invention, it is possible to avoid reduction in responsivity on the short wavelength region, while improving the responsivity over the entire absorbable wavelength region, by using a type II MQW structure.

DESCRIPTION OF THE REFERENCE CHARACTERS

Figure 1A:
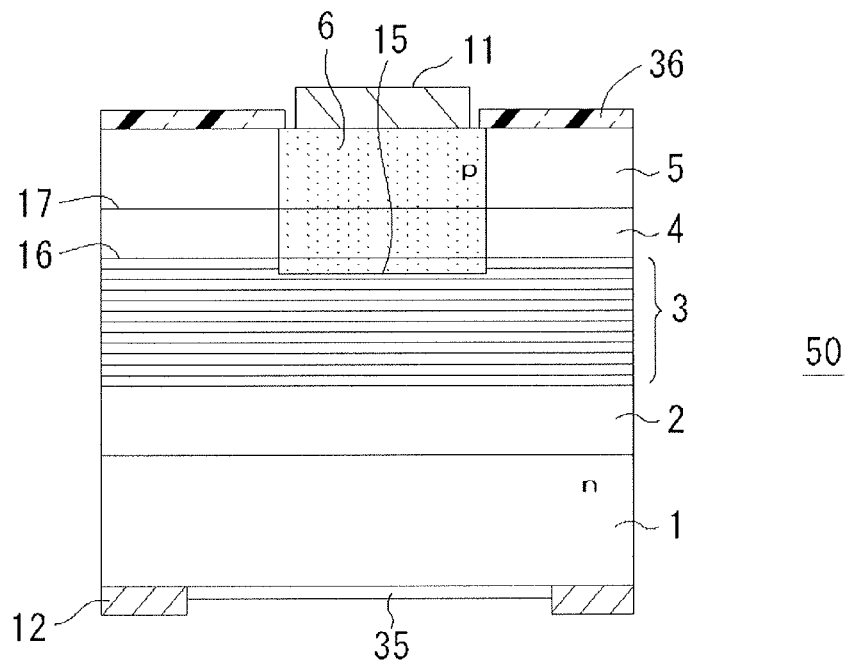
FIG. 1A is a diagram illustrating a photodiode according to an embodiment of the present invention.

1 InP substrate
2 buffer layer (InP and/or InGaAs)
3 type II MQW absorption layer
3a layer (GaAsSb) having higher potential of valence band
3b layer (InGaAs) having lower potential of valence band
3u one pair
4 InGaAs layer (diffusive-concentration-distribution-adjusting layer)
5 InP cap layer
6 p-type region
10 optical sensor device (detection device)
11 p-side electrode (pixel electrode)
12 ground electrode (n-side electrode)
12b bump
15 p-n junction
16 interface between MQW and InGaAs layer
17 interface between InGaAs layer (diffusive-concentration-distribution-adjusting layer) and InP cap layer
35 AR (Anti-Reflection) layer
36 selective diffusion mask pattern
39 interconnection bump
43 passivation layer (SiON layer)
50 photodiode (photodiode array)
50a wafer (interim product)
60 deposition apparatus for all metal-organic source MOVPE
61 infrared thermometer
63 reaction chamber
65 quartz tube
69 window of reaction chamber
66 substrate table
66h heater
70 CMOS
P pixel

DESCRIPTION OF EMBODIMENTS

FIG. 1A is a diagram illustrating a photodiode 50 according to an embodiment of the present invention. The photodiode 50 includes, on an InP substrate 1, an InP-based semiconductor layered structure (epitaxial wafer) having a configuration described below. In FIG. 1A, light is incident on a rear surface of the InP substrate 1. However, light may be incident on the epitaxial wafer side.

(an n-type InP substrate 1/an n-type InP buffer layer 2 (150 nm thick)/a type II (InGaAs/GaAsSb) MQW absorption layer 3/an InGaAs diffusive-concentration-distribution-adjusting layer 4/an InP cap layer 5)

A p-type region 6 is located so as to reach into the MQW absorption layer 3 from the surface of the InP cap layer 5. The p-type region 6 is formed by selectively diffusing Zn as a p-type impurity from an opening of a selective diffusion mask pattern 36 that is an SiN film. The SiN selective diffusion mask pattern 36 allows the Zn to be diffused and introduced into the inside of a peripheral part of the photodiode 50 in a limited manner when viewed in plan. A p-side electrode 11 composed of AuZn is disposed on and in ohmic contact with the p-type region 6, and an n-side electrode 12 composed of AuGeNi is disposed on and in ohmic contact with the rear surface of the InP substrate 1. In this case, the InP substrate 1 is doped with an n-type impurity, and has a predetermined level of conductivity. However, the InP substrate 1 need not have conductivity. In this case, the n-side electrode 12 is disposed in ohmic contact with the n-type InP buffer layer 2. Further, an antireflection layer 35 composed of SiON is provided on the rear surface of the InP substrate 1, and light is incident on the rear surface of the InP substrate. Accordingly, the photodiode 50 shown in FIG. 1A corresponds to the configuration (F1).

In the type II MQW absorption layer 3, a p-n junction 15 is formed at a position corresponding to a boundary front of the p-type region 6. By applying a reverse bias voltage between the p-side electrode 11 and the n-side electrode 12, a larger depletion layer is formed on the side where the n-type impurity concentration is lower (n-type impurity background). The n-type impurity background in the MQW absorption layer 3 has an n-type impurity concentration (carrier concentration) of about 5E15 ($5 \times 10^{15}$) cm$^{-3}$ or lower. The position of the p-n junction 15 is determined by an intersection between the background (n-type carrier concentration) of the MQW absorption layer 3, and the concentration profile of Zn that is a p-type impurity. The InGaAs diffusive-concentration-distribution-adjusting layer 4 is provided in order to adjust the concentration distribution of the p-type impurity in the MQW structure constituting the absorption layer 3. However, the InGaAs diffusive-concentration-distribution-adjusting layer 4 may not be necessarily formed. In the absorption layer 3, the Zn concentration is preferably 5E16 ($5 \times 10^{16}$) cm$^{-3}$ or lower.

Figure 1B:
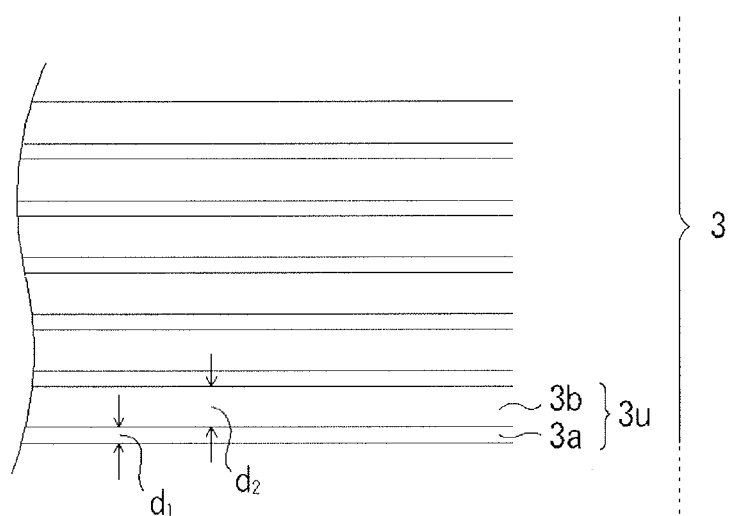
FIG. 1B is a diagram illustrating an MQW structure constituting an absorption layer of the photodiode shown in FIG. 1A.

FIG. 1B is a cross-sectional view illustrating the MQW structure constituting the absorption layer 3. The absorption layer 3 is a type II MQW structure in which InGaAs 3b and GaAsSb 3a form a pair 3u. The number of pairs is not less than 50 but not larger than 700. As described later, if the total thickness of the MQW structure is excessively increased, the responsivity on the short wavelength side is degraded. Therefore, the number of pairs is preferably about 200 to 300.

The present invention is characterized in that, between the two compound semiconductors constituting the pair 3u, the thickness of the compound semiconductor having a higher valence band is made smaller than the thickness of the compound semiconductor having a lower valence band. In the above case of InGaAs and GaAsSb, the valence band of the GaAsSb 3a is higher than that of the InGaAs 3b. Therefore, the thickness of the GaAsSb 3a is made smaller than the thickness of the InGaAs 3b. Specifically, InGaAs (5 nm)/GaAsSb (2 nm) is preferable.

In the present invention, the photodiode has the following objects.

(M1) To extend the responsivity toward the longer wavelength side in the near infrared region as much as possible.

(M2) To have high responsivity over the entire wavelength region of the near infrared.

(M3) To make the wavelength dependence of responsivity gentle or preferably flat, with avoiding a sharp drop in responsivity on the short wavelength side. In particular, a sharp drop in responsivity at a wavelength near 1.5 μm should be avoided.

Figure 2:
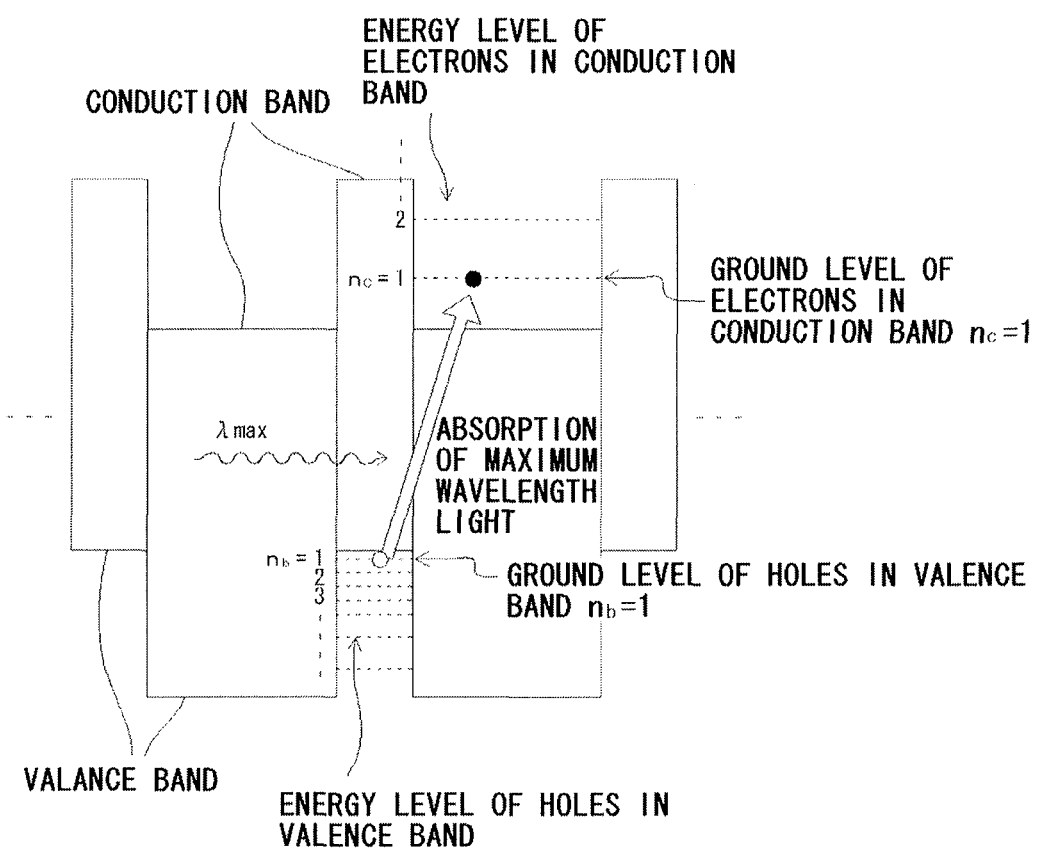
FIG. 2 is a diagram for explaining the technical content of the present invention.

FIG. 2 is a diagram for explaining the technical content of the present invention. In the type II MQW structure, it is possible to realize absorption of long wavelength light, i.e., transition with small energy gap for electrons in the photodiode. That is, electrons in the valence band of GaAsSb having the higher valence band potential transit to the conduction band of InGaAs having the lower valence band potential, thereby enabling transition with small energy gap or absorption of long wavelength light (refer to FIG. 2). Holes generated in the valence band need to move in the MQW structure 3 to reach the p-side electrode. As described above, the holes disappear while moving in the MQW structure 3, which is a major cause of reduction in responsivity. As described later, in order to avoid such reduction in responsivity due to disappearance of holes during moving in the MQW structure, the total thickness of the MQW structure 3 should be reduced. The reason is that the distance in which the holes should move against the well type potential barriers is shortened. Further, accompanying increase in electric field intensity (increase in driving force) can also be expected. However, uniform reduction in the thicknesses of the respective layers to decrease the total thickness of the MQW structure causes unacceptable adverse effect. The following is preparation for explaining the adverse effect.

The energy level of holes in the potential well in the valence band and the energy level of electrons in the potential well in the conduction band can be approximated by the following model. That is, these energy levels can be approximated as the energy levels of electrons or holes in a potential well having a finite width and an infinite depth (height). According to the model, the energy level is represented by the following equation (M).

$$En = h^2 n^2/(8d^2 m^*) \quad (M)$$

where, n is the excited-state index or the excitation level (n=1 in the ground state), h is the Plank's constant, d is the width (size) of the potential well, and $m^*$ is the effective mass of electrons or holes.

When the above model is applied to holes in the potential well in the valence band of GaAsSb, the following equation (1) is obtained.

Energy level of holes in potential well in valence band:

$$Eb_n = h^2 n_b^2/(8d_1^2 m_1^*) \quad (1)$$

where $n_b$ is the index indicating the excited state of holes in the potential well in the valence band ($n_b$=1 in the ground state), $d_1$ is the thickness of the compound semiconductor (e.g., GaAsSb) having the higher valence band potential, and $m_1^*$ is the effective mass of holes.

Particularly, the ground level is represented by $$Eb_1 = h^2/(8d_1^2 m_1^*) \quad (1-1)$$

On the other hand, when the above model is applied to electrons in the potential well in the conduction band of InGaAs, the following equation (2) is obtained.

Energy level of electrons in potential well in conduction band:

$$Ec_n = h^2 n_c^2/(8d_2^2 m_2^*) \quad (2)$$

where, $n_c$ is the index indicating the excited state of electrons in the potential well in the conduction band ($n_c$=1 in the ground state), $d_2$ is the thickness of the compound semiconductor (e.g., InGaAs) having the lower valence band potential, and $m_2^*$ is the effective mass of electrons.

Particularly, the ground level is represented by $$Ec_1 = h^2/(8d_2^2 m_2^*) \quad (2-1)$$

The effective mass ($m_1^*$) of holes in equation (1) and the effective mass ($m_2^*$) of electrons in equation (2) are significantly different from each other. It is very important that the effective mass of holes is about ten times or more greater than the effective mass of electrons, which forms the basis of the present invention.

Through the above preparation, a description will be given of disadvantages associated when the thicknesses of the respective layers in the MQW structure are uniformly reduced. In absorption of light of an absorbable limit wavelength, electrons positioned in the ground state (level) in the valence band of GaAsSb transit to the ground state in the conduction band of InGaAs. That is, the maximum absorbable wavelength λmax corresponds to a difference between the ground level $Ec_1$ in the potential well in the conduction band of InGaAs and the ground level $Eb_1$ in the potential well in the valence band of GaAsSb. That is, $(Ec_1 - Eb_1) = hc/\lambda max$ is satisfied. Note that various exclusion principles are applied to transition of electrons, and therefore, actual transition of electrons may not be as simple as shown in FIG. 2. However, it is assumed that such exclusion principles are not applied. Even with this assumption, the transition scheme shown in FIG. 2 is effective as a basis of semi-quantitative way of thinking.

It is assumed that the thicknesses of the respective layers in the MQW structure are uniformly reduced to reduce the total thickness of the MQW structure. Then, according to the above equations (1-1) and (2-1), the ground level of holes in the potential well in the valence band and the ground level of electrons in the potential well in the conduction band change so as to separate from each other (so as to increase the energy gap). That is, the ground level of holes increases with reduction in the thickness $d_1$ in $Eb_1 = h^2/(8d_1^2 m_1^*)$. On the other hand, the ground level of electrons increases with reduction in the thickness $d_2$ in $Ec_1 = h^2/(8d_2^2 m_2^*)$. As a result, the energy gap ($Ec_1 - Eb_1$) increases, and the limit of absorbable wavelength significantly shifts toward the shorter wavelength side. That is, the limit wavelength, which is absorbable if the thicknesses of the layers in the MQW structure are not uniformly reduced, becomes non-absorbable because of the increase in the band gap or the energy gap. This is unacceptable for the photodiode which has the above-described object (M1), and attempts to extend, as much as possible, the responsivity toward the longer wavelength side.

However, if attention is focused on the effective mass, the effective mass of holes is about ten times or more greater than the effective mass of electrons, and therefore, the ground level of holes has originally been about ten times as low as the ground level of electrons (a difference between the respective ground levels in the vacuum states). Therefore, when the thicknesses of both GaAsSb and InGaAs are uniformly reduced, the degree of increase in the ground level of electrons in the potential well in the conduction band is significantly greater than that of holes as shown in FIG. 2. Specifically, it is about ten times as great as the degree of increase in the ground level of holes in the potential well in the valence band. Thus, the increase in the band gap or the energy gap with the uniform reduction in the thicknesses of GaAsSb and InGaAs is mainly caused by the increase in the ground level of electrons in the conduction band.

The fundamental thought of the present invention is to reduce the total thickness of the MQW structure by reducing only the thickness $d_1$ of the compound semiconductor (GaAsSb) having the higher valence band potential, without significantly reducing the maximum absorbable wavelength. Thereby, the following advantages are achieved.

Figure 3A:
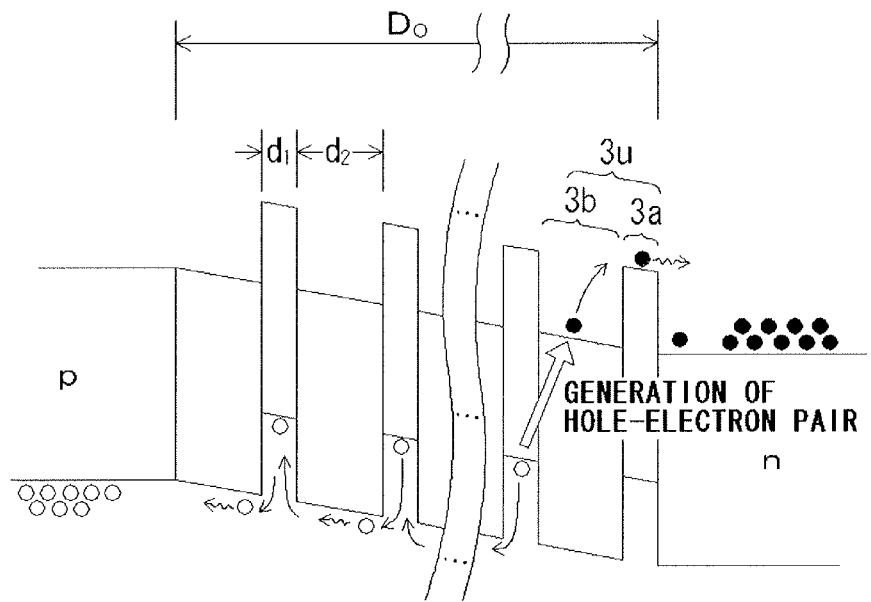
FIG. 3A is a diagram illustrating an MQW band structure when the photodiode of the embodiment absorbs light.
Figure 3B:
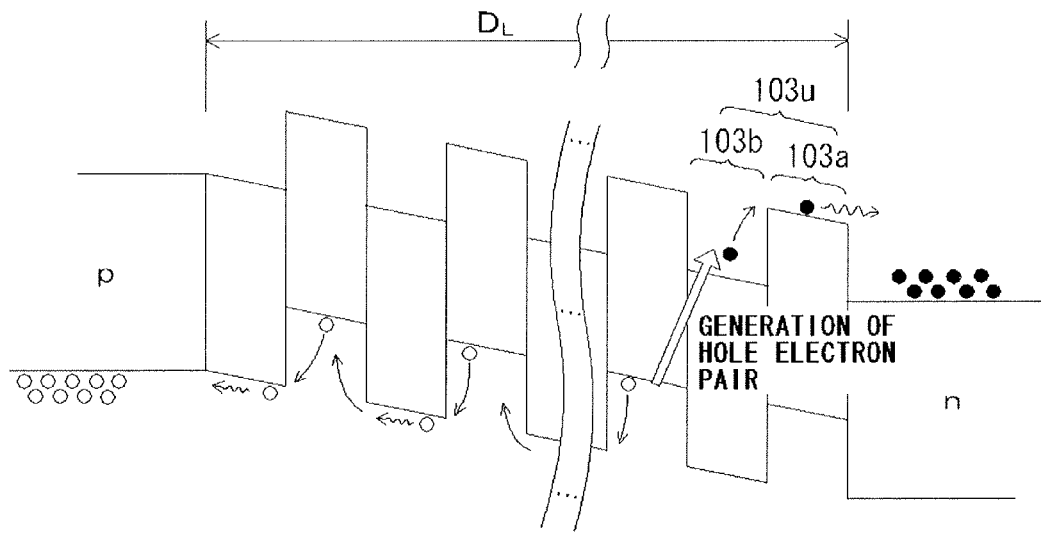
FIG. 3B is a diagram illustrating an MQW band structure when a conventional photodiode absorbs light.

(E1) Since the total thickness Do is greatly reduced as shown in FIG. 3A, even if holes are generated in a position far apart from the p-side electrode, the holes are highly likely to reach the p-side region or the p-side electrode, and thereby the responsivity can be improved. In particular, light on the short wavelength side tends to be absorbed as soon as it enters the MQW and generate holes. Therefore, as shown in FIG. 3B, conventionally, light on the short wavelength side often disappeared halfway in the MQW structure 3 having a large total thickness $D_L$. In FIG. 3B, both GaAsSb 103a and InGaAs 103b forming a pair 103u have a thickness of 5 nm as in the conventional MQW structure. However, in the present invention, it is possible to secure the responsivity by reducing the total thickness of the MQW structure.

Thereby, it is possible to improve the responsivity over the absorbable wavelength region, and prevent the responsivity from dropping on the short wavelength side, more effectively. As a result, the responsivity can be made flat with respect to the wavelength, or its variation can be made gentle.

(E2) When the same reverse bias voltage V is applied, it is found that the electric field increases with reduction in the total thickness of the MQW structure 3. That is, when Do is smaller than $D_L$ (Do<$D_L$), (V/Do) is larger than (V/$D_L$) ((V/Do)>(V/$D_L$)). As a result, the electric filed generated by the reverse bias voltage drives (accelerates) the holes and the electrons more forcefully to cause them to move toward the respective electrodes.

(E3) As said before, it is possible to keep the maximum absorbable wavelength almost unchanged by reducing the thickness of one (e.g., GaAsSb) of paired compound semiconductor layers, which has the higher valence band potential, without reducing the thickness of the other compound semiconductor layer.

<MQW Growth Method>

A description will be given of a manufacturing method. An InP substrate 1 is prepared. On the InP substrate 1, an InP buffer layer 2, a type II (InGaAs/GaAsSb) MQW absorption layer 3, an InGaAs diffusive-concentration-distribution-adjusting layer 4, and an InP cap layer 5 are grown by all metal-organic source MOVPE.

Figure 4:
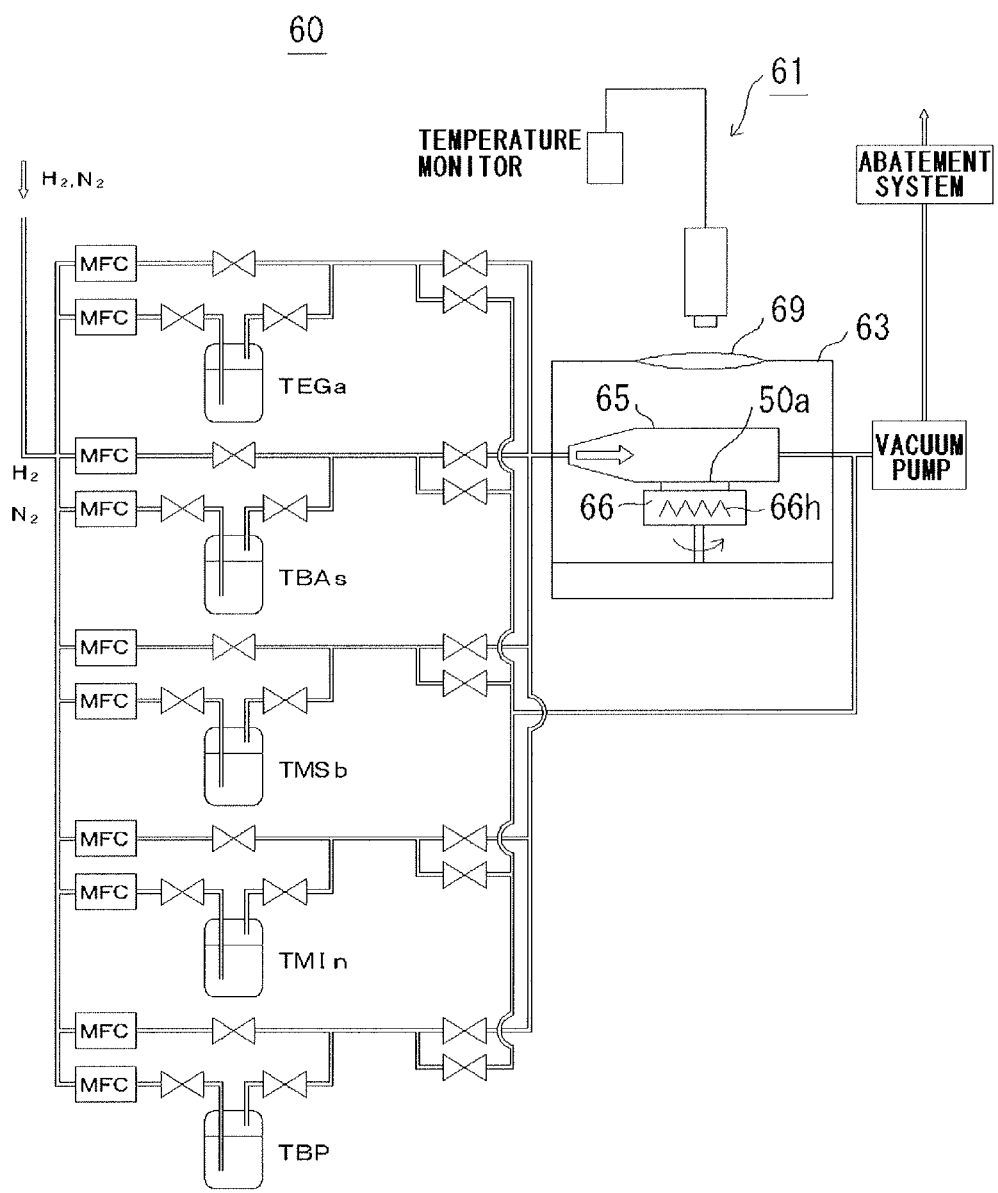
FIG. 4 is a diagram illustrating a piping system and the like of a deposition apparatus for all metal-organic source MOVPE.

FIG. 4 illustrates a piping system and the like of a deposition apparatus 60 for all metal-organic source MOVPE. A quartz tube 65 is placed inside a reaction chamber 63, and source gases are introduced into the quartz tube 65. In the quartz tube 65, a substrate table 66 is placed rotatably and hermetically. The substrate table 66 is provided with a heater 66h for heating a substrate. The temperature at a surface of a wafer 50a during deposition is monitored by an infrared thermometer 61 through a window 69 provided at a ceiling of the reaction chamber 63. The monitored temperature is a temperature which is referred to as a temperature at which growth is performed, or a deposition temperature, or a substrate temperature. When it is described that an MQW structure is formed at a temperature not lower than 400° C. but not higher than 560° C. in the manufacturing method of the present invention, this temperature ranging from 400° C. to 560° C. is a temperature measured by the thermometer. Forced evacuation from the quartz tube 65 is performed by means of a vacuum pump.

Source gases are supplied through pipes connected to the quartz tube 65. All metal-organic source MOVPE is characterized by that all source gases are supplied in forms of metal-organic gases. Although source gases of dopants or the like are not shown in FIG. 4, dopants are also supplied in forms of metal-organic gases. The metal-organic gases are stored in a constant temperature bath and kept at a constant temperature. Hydrogen ($H_2$) and nitrogen ($N_2$) are used as carrier gases. The metal-organic gases are carried by the carrier gases, and evacuated by the vacuum pump to be introduced into the quartz tube 65. The amount of the carrier gases is precisely controlled by mass flow controllers (MFCs). Many MFCs, electromagnetic valves, and the like are automatically controlled by a microcomputer.

Control of the thickness of the MQW 3 is performed by setting a program, and controlling the MFC, the electromagnetic valves, and the like.

A method of manufacturing the wafer 50a will be described. First, an s-type InP buffer layer 2 is epitaxially grown to a thickness of 150 nm on an S-doped n-type InP substrate 1. Tetraethylsilane (TeESi) is used as an n-type dopant. At this time, trimethylindium (TMIn) and tertiarybutylphosphine (TBP) are used as source gases. The InP buffer layer 2 may be grown by using phosphine ($PH_3$) as an inorganic source. Even if the InP buffer layer 2 is grown at a growth temperature of about 600° C. or lower, the crystallinity of the underlying InP substrate is not degraded by the heating at about 600° C. However, when forming an InP cap layer, since the MQW structure including GaAsSb is disposed under the InP cap layer, the substrate temperature needs to be precisely maintained within a range of, for example, not lower than 400° C. but not higher than 560° C. The reason is as follows. If the wafer is heated to about 600° C., the GaAsSb is damaged by the heat, and its crystallinity is significantly degraded. In addition, if the InP cap layer is formed at a temperature lower than 400° C., the source gas decomposition efficiency is significantly reduced, and thereby the impurity concentration in the InP layer is increased. Therefore, a high-quality InP cap layer cannot be obtained.

Next, a type II MQW absorption layer 3 having InGaAs/GaAsSb as a pair of quantum wells is formed. As described above, in the quantum well structure, the GaAsSb 3a preferably has a thickness of about 2 nm, and the InGaAs 3b preferably has a thickness of 5 nm, for example. In FIG. 1B, 250 pairs of quantum wells are deposited to form the MQW absorption layer 3. For deposition of the GaAsSb, triethylgallium (TEGa), tertiarybutylarsine (TBAs), and trimethylantimony (TMSb) are used. For deposition of the InGaAs, TEGa, TMIn, and TBAs can be used. All the source gases are organic-metal gases, and the molecular weight of each compound is great. Therefore, the source gases are completely decomposed at a relatively low temperature not lower than 400° C. but not higher than 560° C., thereby contributing to the crystal growth. The composition change at an interface of quantum wells can be made sharp by forming the MQW absorption layer 3 by all metal-organic source MOVPE. As a result, highly accurate spectrophotometry is realized.

As a source of gallium (Ga), triethylgallium (TEGa) or trimethylgallium (TMGa) may be used. As a source of indium (In), trimethylindium (TMIn) or triethylindium (TEIn) may be used. As a source of arsenic (As), tertiarybutylarsine (TBAs) or trimethylarsenic (TMAs) may be used. As a source of antimony (Sb), trimethylantimony (TMSb) or triethylantimony (TESb) may be used. Alternatively, triisopropylantimony (TIPSb) or trisdimethylaminoantimony (TDMASb) may be used. By using these sources, a semiconductor device in which an MQW structure has low impurity concentration and excellent crystallinity can be obtained. As a result, if the semiconductor device is applied to, for example, a photodiode, a photodiode having reduced dark current and high responsivity can be obtained. Moreover, by using the photodiode, an optical sensor device, such as an imaging device, capable of taking clearer images can be realized.

Next, a description will be given of how the source gases flow during formation of the MQW structure 3 by all metal-organic source MOVPE. The source gases are carried through the pipes, introduced into the quartz tube 65, and evacuated. Many kinds of source gases can be supplied to the quartz tube 65 by increasing the number of pipes. For example, even if dozen kinds of source gases are used, the source gases are controlled by open/close of the electromagnetic valves.

Flow of each source gas into the quartz tube 65 is turned on/off according to open/close of the electromagnetic valve, with the flow rate of the source gas being controlled by the mass flow controller (MFC) shown in FIG. 4. Then, the source gases are forcibly evacuated from the quartz tube 65 by the vacuum pump. The flow of the source gases is not interrupted but smoothly and automatically conducted. Accordingly, switching of compositions when forming the pairs of quantum wells is quickly performed.

Since the substrate table 66 rotates as shown in FIG. 4, the source gas temperature distribution does not have a directionality such that the source gas temperature is higher/lower at the source gas inlet side than at the source gas outlet side. Further, since the wafer 50*a* revolves on the substrate table 66, the flow of the source gas near the surface of the wafer 50*a* is in a turbulence state. Therefore, even the source gas near the surface of the wafer 50*a*, excluding the source gas contacting the wafer 50*a*, has a great velocity component in the direction of gas flow from the gas inlet side toward the gas outlet side. Accordingly, the heat, which flows from the substrate table 66 through the wafer 50*a* to the source gas, is mostly exhausted together with the exhaust gas, constantly. This causes a great temperature gradient or temperature gap in the vertical direction from the wafer 50*a* through its surface to the source gas space.

Further, in the embodiment of the present invention, the substrate temperature is set in a low temperature range of not lower than 400° C. but not higher than 560° C. When all metal-organic source MOVPE using metal-organic sources such as TBAs is performed at such a low substrate surface temperature, the decomposition efficiency of the source is high. Therefore, the source gases, which flow in a region very close to the wafer 50*a* and contribute to the growth of the MQW structure, are limited to those efficiently decomposed into a form required for the growth.

Figure 5A:
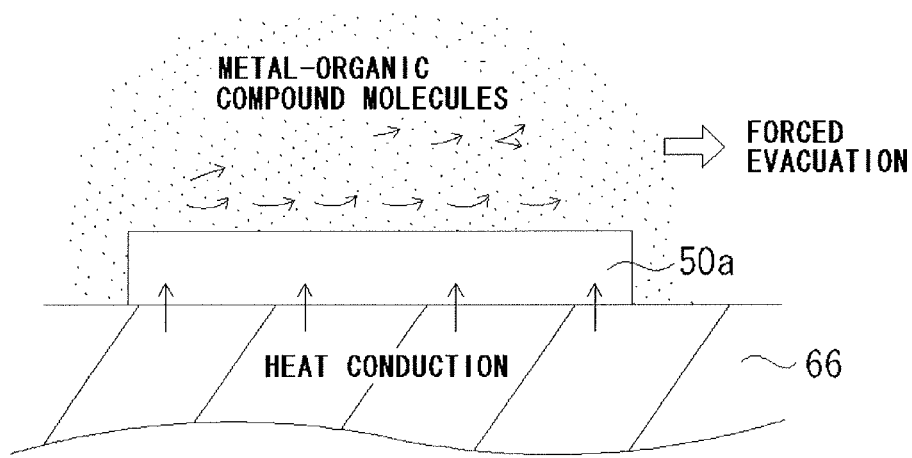
FIG. 5A is a diagram illustrating a flow of metal-organic molecules and a thermal flow.
Figure 5B:
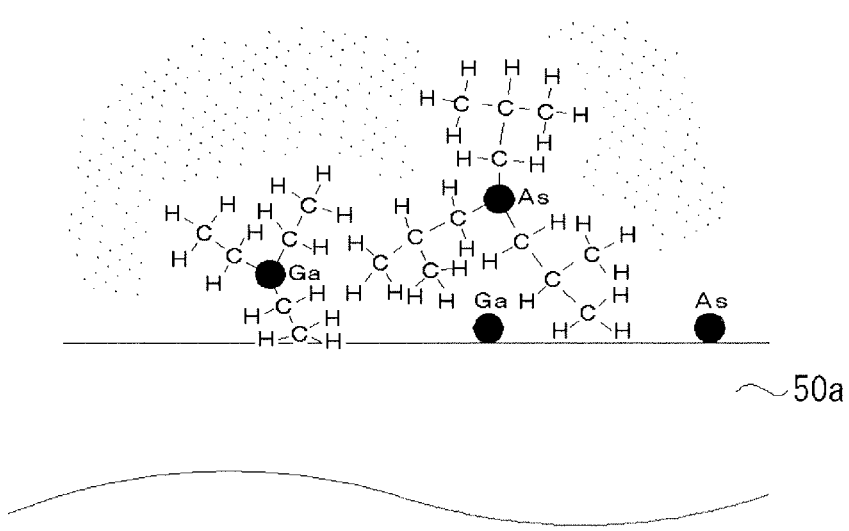
FIG. 5B is a schematic diagram illustrating metal-organic molecules at a substrate surface.

FIG. 5A is a diagram illustrating the flow of metal-organic molecules and the thermal flow, and FIG. 5B is a schematic diagram illustrating the metal-organic molecules at the substrate surface. These figures are used for explaining that setting of the surface temperature is important in order to obtain sharp composition change at heterointerfaces in the MQW structure.

Although it is assumed that the surface of the wafer 50*a* is at the monitored temperature, a sharp temperature drop or a great temperature gap occurs as described above in the source gas space a little above the wafer surface. Therefore, in the case of using a source gas whose decomposition temperature is T1° C., the substrate surface temperature is set at (T1+α)° C., and the α is determined in view of variation in temperature distribution and the like. Under the situation where a sharp temperature drop or a great temperature gap occurs from the surface of the wafer 50*a* to the source gas space, if large-size metal-organic molecules as shown in FIG. 5B flow against the wafer surface, the compound molecules that are decomposed and contribute to crystal growth are considered to be limited to those that contact the wafer surface and those in a range equivalent to the thicknesses of a few metal-organic molecules from the wafer surface. Accordingly, as shown in FIG. 5B, it is considered that the metal-organic molecules contacting the wafer surface and the metal-organic molecules located within the region equivalent to the thicknesses of a few metal-organic molecules from the wafer surface mainly contribute to crystal growth, while the metal-organic molecules located outside the region are less likely to be decomposed and are evacuated from the quartz tube 65. When the metal-organic molecules near the surface of the wafer 50*a* are decomposed and contribute to crystal growth, the metal-organic molecules located outside the region enter the region as supplemental molecules.

Taking the converse point of view, by setting the wafer surface temperature at a temperature slightly higher than the decomposition temperature of the metal-organic molecules, the range of the metal-organic molecules that can participate in crystal growth can be limited to the thin source gas layer on the surface of the wafer 50*a*.

As understood from the above description, when the source gases suited to the chemical compositions of the above-described pair are introduced by switching the gases using the electromagnetic valves while forcibly evacuating the gases using the vacuum pump, the crystal growth is performed such that, after a crystal of the previous chemical composition was grown with slight inertia, a crystal of the chemical composition, to which the source gases have been switched, can be grown without being affected by the previous source gases. As a result, the composition change at the heterointerface can be made sharp. Such a sharp composition change means that the previous source gases do not substantially remain in the quartz tube 65, and is caused by that the source gases that flow in the region very close to the wafer 50*a* and contribute to the growth of the MQW structure are limited those efficiently decomposed into the form required for the growth (deposition factor 1). Specifically, as seen from FIG. 4, after one of the two layers in the quantum well is formed, the source gases for forming the other layer is introduced by opening/closing the electromagnetic valves while forcibly evacuating the gases with the vacuum pump. At this time, although some metal-organic molecules that participate in the crystal growth with slight inertia remain, the molecules of the one layer that may act as supplemental molecules are mostly evacuated and gone. As the wafer surface temperature is set closer to the decomposition temperature of the metal-organic molecules, the range of the metal-organic molecules that participate in the crystal growth (the range from the wafer surface) is reduced.

In the case of forming the MQW structure, if the MQW structure is grown at a temperature of about 600° C., phase separation occurs in the GaAsSb layers in the MQW structure, which makes it impossible to realize a clean and flat crystal growth surface of an MQW structure, and an MQW structure having excellent periodicity and crystallinity. Therefore, the growth temperature is set in the range of not lower than 400° C. but not higher than 560° C. (deposition factor 2), and all metal-organic source MOVPE is adopted as a deposition method for this growth, in which metal-organic gases having high decomposition efficiency are used as all source gases (deposition factor 3). The deposition factor 1 significantly depends on the deposition factor 3.

<Semiconductor Device Manufacturing Method>

In the semiconductor device 50 shown in FIG. 1A, the InGaAs diffusive-concentration-distribution-adjusting layer 4 is located on the type II MQW absorption layer 3, and the InP cap layer 5 is located on the InGaAs diffusive-concentration-distribution-adjusting layer 4. Zn as a p-type impurity is selectively diffused from the opening of the selective diffusion mask pattern 36 disposed on the surface of the InP cap layer 5, thereby forming the p-type region 6. A p-n junction or p-i junction 15 is formed at an end of the p-type region 6. A reverse bias voltage is applied to the p-n junction or p-i junction 15 to form a depletion layer which traps charges caused by photoelectric conversion, and thus the brightness of a pixel is made responsive to the amount of charges. The p-type region 6 or the p-n junction (p-i junction) 15 is a main part that constitutes a pixel. The p-side electrode 11 that is in ohmic-contact with the p-type region 6 is a pixel electrode, and the amount of charges is read, pixel by pixel, between the p-side electrode 11 and the n-side electrode 12 that is set at the ground voltage. On the surface of the InP cap layer that surrounds the p-type region 6, the selective diffusion mask pattern 36 is left as it is. Further, a passivation layer (not shown) composed of SiON or the like covers the selective diffusion mask pattern 36. The reason why the selective diffusion mask pattern 36 is left is as follows. After formation of the p-type region 6, if the selective diffusion mask pattern 36 is removed and the wafer is exposed to the atmosphere, a surface level is formed at the boundary between the surface of the p-type region and the surface of a region where the mask pattern 36 is removed from the cap layer, which causes an increase in dark current.

It is a point that, after formation of the MQW structure, growth is continued in the same deposition chamber or quartz tube 65 by all metal-organic source MOVPE until formation of the InP cap layer 5 is completed. In other words, it is a point that no regrown interface is formed because the wafer 50a is not taken out from the deposition chamber before formation of the InP cap layer 5 to form the cap layer 5 by another deposition method. That is, since the InGaAs diffusive-concentration-distribution-adjusting layer 4 and the InP cap layer 5 are continuously formed in the quartz tube 65, the interfaces 16 and 17 are not regrown interfaces. Therefore, the oxygen concentration and the carbon concentration are both lower than 1E17 ($1 \times 10^{17}$)cm$^{-3}$, and no leakage current occurs particularly at a line where the p-type region 6 and the interface 17 intersect.

In the present embodiment, the non-doped InGaAs diffusive-concentration-distribution-adjusting layer 4 having a thickness of, for example, 1.0 μm is formed on the MQW absorption layer 3. After formation of the InP cap layer 5, when Zn as a p-type impurity is introduced from the InP cap layer 5 to reach the MQW absorption layer 3 by a selective diffusion method, if the high-concentration Zn enters the MQW structure, the crystallinity is degraded. The InGaAs diffusive-concentration-distribution-adjusting layer 4 is provided for adjusting the Zn diffusion. The InGaAs diffusive-concentration-distribution-adjusting layer 4 is not necessarily provided as described above.

The p-type region 6 is formed by the above-described selective diffusion, and the p-n junction or p-i junction 15 is formed at an end of the p-type region 6. Even when the InGaAs diffusive-concentration-distribution-adjusting layer 4 is inserted, since the InGaAs has a small band gap, the electric resistance of the photodiode can be reduced even if the InGaAs is non-doped. The reduced electric resistance leads to an increase in responsivity, thereby realizing a moving picture of high image quality.

Preferably, the undoped InP cap layer 5 is epitaxially grown to a thickness of 0.8 μm on the InGaAs diffusive-concentration-distribution-adjusting layer 4 by all metal-organic source MOVPE, with the wafer 50a being placed in the same quartz tube 65. As described above, trimethylindium (TMIn) and tertiarybutylphosphine (TBP) are used as source gases. The use of these source gases allows the growth temperature of the InP cap layer 5 to be not lower than 400° C. but not higher than 560° C., and more preferably, not higher than 535° C. As a result, the GaAsSb in the MQW structure located under the InP cap layer 5 is not damaged by heat, and the crystallinity of the MQW structure is not degraded. When forming the InP cap layer 5, since the MQW structure including GaAsSb is disposed under the InP cap layer 5, the substrate temperature should be precisely maintained within a range of not lower than 400° C. but not higher than 560° C. The reason is as follows. If the wafer is heated to about 600° C., the GaAsSb is damaged by the heat, and its crystallinity is significantly degraded. If the InP cap layer is formed at a temperature lower than 400° C., the source gas decomposition efficiency is significantly reduced, and thereby the impurity concentration in the InP cap layer 5 is increased. Therefore, a high-quality InP cap layer 5 cannot be obtained.

As described above, conventionally, a MQW structure has to be formed by MBE. However, growth of an InP cap layer by MBE requires a solid source as a source of phosphorus, which leads to a problem in terms of safety or the like. Further, there is still a room for improvement in terms of manufacturing efficiency.

Prior to the present invention, the interface between the InGaAs diffusive-concentration-distribution-adjusting layer and the InP cap layer was a regrown interface once exposed to the atmosphere. The regrown interface can be identified when it satisfies either the oxygen concentration of 1E17 ($1 \times 10^{17}$) cm$^{-3}$ or more or the carbon concentration of 1E17 ($1 \times 10^{17}$) cm$^{-3}$ or more, which concentrations can be confirmed by secondary ion mass spectrometry. The regrown interface and the p-type region form an intersection line, and leakage current occurs in the intersection line. Such leakage current significantly degrades the image quality.

Further, if the InP cap layer is grown by simple MOVPE using phosphine ($PH_3$) as a source of phosphorus, the decomposition temperature of phosphine is high. Such high decomposition temperature induces a thermal damage of the underlying GaAsSb, and thus the crystallinity of the MQW structure is degraded.

Figure 6:
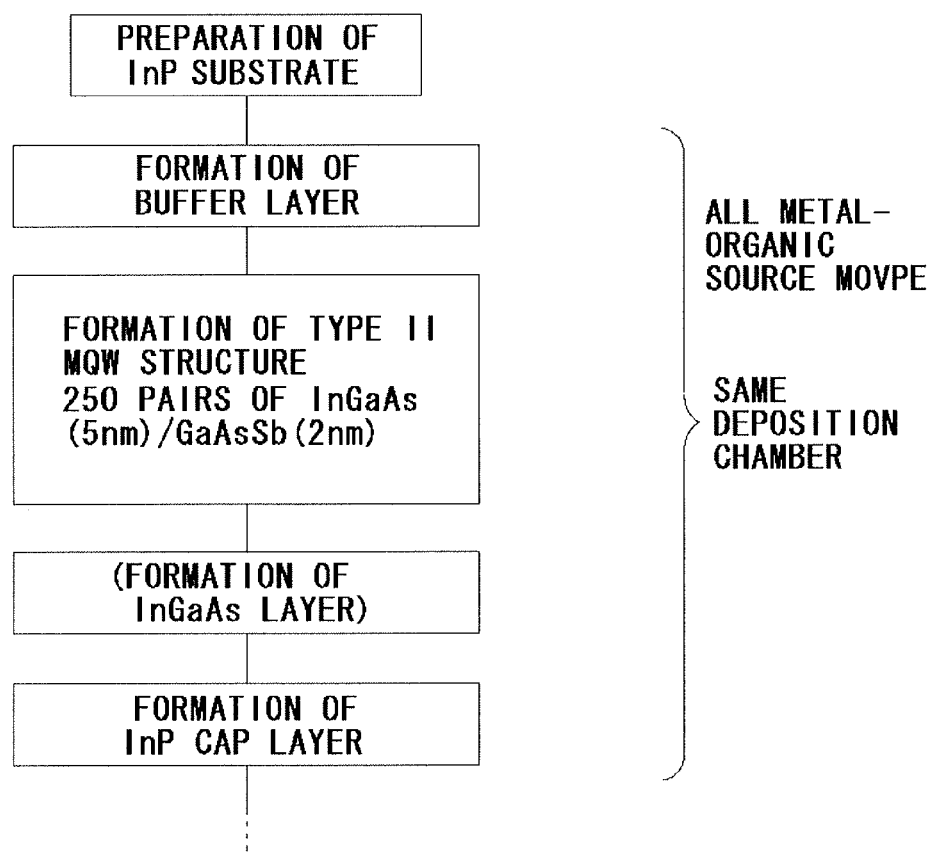
FIG. 6 is a flowchart illustrating a method of manufacturing the photodiode shown in FIG. 1A.

FIG. 6 is a flowchart of a method of manufacturing the photodiode 50 shown in FIG. 1A. In this manufacturing method, it is important to reduce the growth temperature (deposition factor 2) by using only metal-organic gases as source gases (deposition factor 3), and to avoid formation of a recrystallization interface (deposition factor 4) by growing the layers consistently in the same deposition chamber or quartz tube 65 until formation of the InP cap layer 5 is completed. Thereby, photodiodes having less leakage current, excellent crystallinity, and responsivity in the long wavelength region of the near infrared can be efficiently manufactured in large numbers.

Figure 7:
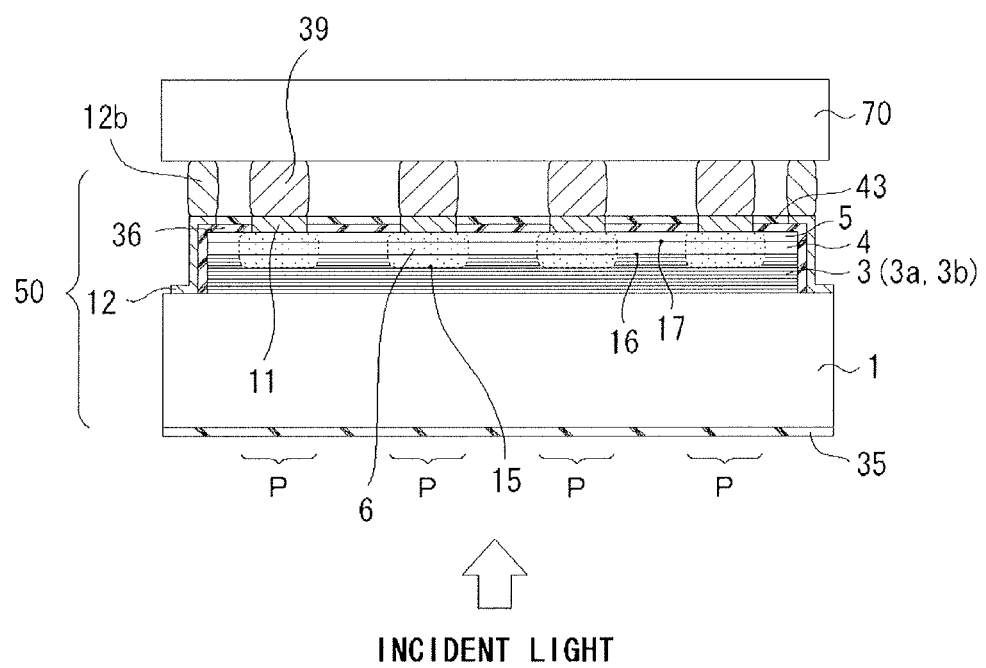
FIG. 7 is a diagram illustrating an optical sensor device including a photodiode of the present invention in which a plurality of pixels are arrayed.

The above-described photodiode 50 includes one pixel. In the present invention, however, a plurality of pixels may be arrayed one-dimensionally or two-dimensionally. FIG. 7 illustrates an optical sensor device 10 including a photodiode array (semiconductor device) 50 in which a plurality of pixels are arrayed. Optical components such as lenses are omitted. Although a passivation layer 43 composed of an SiON layer is shown in FIG. 7, the passivation layer is actually provided also in FIG. 1A. The photodiode array 50 and the photodiode shown in FIG. 1A have the same layered structure, and are different in that the photodiode array 50 comprises a plurality of photodiodes or pixels P. Further, the photodiode array 50 is identical to the photodiode (semiconductor device) shown in FIG. 1A in that the interfaces 16 and 17 are not regrown interfaces, and the impurity concentrations of oxygen, carbon, and the like are lower than 1E17 ($1 \times 10^{17}$) cm$^{-3}$.

In FIG. 7, the photodiode array 50 and a CMOS 70 constituting a readout IC are connected. Readout electrodes (not shown) of the CMOS 70 and pixel electrodes (p-side electrodes) 11 of the photodiode array 50 are connected via interconnection bumps 39. A ground electrode (n-side electrode) 12 common to the pixels of the photodiode array 50, and a ground electrode (not shown) of the CMOS 70 are connected via a bump 12b. It is possible to realize an imaging device or the like by combining the CMOS 70 and the photodiode array 50, and integrating, pixel by pixel, light absorption information.

As described above, the photodiode array (semiconductor device) 50 of the present invention has responsivity up to the long wavelength region, and reduced dark current (leakage current). Therefore, when applied to biological tests for animals and plants, environmental monitoring, and the like, the photodiode array 50 can execute highly precise examination.

EXAMPLES

Example 1

Invariance of Long Wavelength Region Absorbable by Photodiode of the Present Invention Samples were prepared in which the photodiode 50 having the same structure as the semiconductor device 50 shown in FIG. 1A was adopted as a fundamental structure, and the MQW structure was varied. The absorbable long wavelength region of each sample was verified. The samples were manufactured according to the above-described method. Evaluation of the absorbable long wavelength region was performed by measuring the PL (Photoluminescence) peak wavelength. The measurement temperature was room temperature (25° C.). The type II (InGaAs/GaAsSb) MQW structure of the present invention may or may not intend to have a strain-compensated super-lattice structure. However, the PL peak wavelength to be an index of the absorbable long wavelength region is greatly influenced by strain ($\Delta\omega$).

Assuming that the lattice mismatch of InGaAs in (GaAsSb/InGaAs) is $\Delta\omega_1$ and the lattice mismatch of GaAsSb is $\Delta\omega_2$, the lattice mismatch $\Delta\omega$ of the entire MQW structure is defined by $\Delta\omega=\{\Sigma(\Delta\omega_1 \times \text{InGaAs thickness} + \Delta\omega_2 \times \text{GaAsSb thickness})\}/\{\Sigma(\text{InGaAs thickness} + \text{GaAsSb thickness})\}$.

Because of the influence of the strain ($\Delta\omega$), verification of the effect caused by reducing the thickness of only the GaAsSb layer in the MQW structure needs to be performed while monitoring the effect of the strain. The strain can be varied by varying the compositions of InGaAs and GaAsSb within a minute range to vary the lattice mismatch. In the samples (Invention Examples and Comparative Examples) described below, the compositions are varied to vary the strain ($\Delta\omega$). Although each sample includes as many samples as the number of strain values, the samples of the same MQW thickness are represented as the same sample.

Invention Example A

An MQW structure having 250 pairs of InGaAs (5 nm thick) and GaAsSb (2 nm thick) is prepared. The total thickness of the MQW structure is 1750 nm (1.75 μm).

Comparative Example B1

An MQW structure having 250 pairs of InGaAs (5 nm thick) and GaAsSb (5 nm thick) is prepared. The total thickness of the MQW structure is 2500 nm (2.5 μm).

Comparative Example B2

An MQW structure having 250 pairs of InGaAs (3.5 nm thick) and GaAsSb (3.5 nm thick) is prepared. The total thickness of the MQW structure is 1750 nm (1.75 μm).

Figure 8:
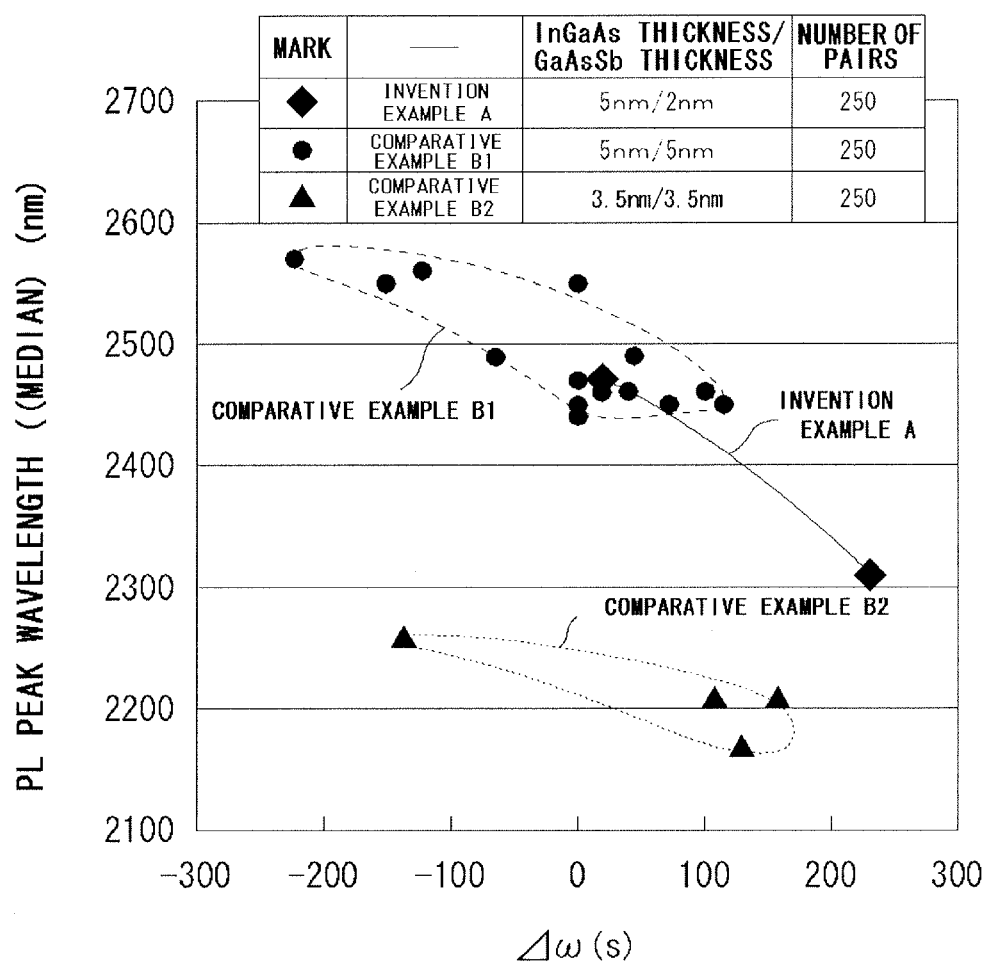
FIG. 8 is a diagram illustrating a measurement result of PL peak wavelengths (medians) of samples in Example 1.

The measured PL peak wavelengths (medians) are shown in FIG. 8. FIG. 8 clarifies the following matters.

(R1) Considering the effect that, even with the same thickness composition of the MQW structure, the PL peak wavelength is shortened when the strain ($\Delta\omega$) is positively increased, it is found that Invention Example A shows the same PL peak wavelength as Comparative Example B1. The thickness of InGaAs in the MQW structure of Invention Example A is 5 nm, and the thickness of InGaAs in the MQW structure of Comparative Example B1 is also 5 nm. On the other hand, in Comparative Example B2 in which the thickness of InGaAs is reduced to 3.5 nm, the PL peak wavelength significantly shifts toward the shorter wavelength side. In Invention Example A, even though the thickness of GaAsSb is reduced to 2 nm, the PL peak wavelength is the same as that of Comparative Example B1 as described above.

This result shows that, in the present invention, the PL peak wavelength remains almost unchanged if the thickness of InGaAs which is one of the pair of compound semiconductors in the MQW structure and has the lower valence band potential, is the same. This verifies that the assumption based on the above equations (1-1) and (2-1) holds true with favorable approximation.

(R2) On that basis, in Invention Example A, the total thickness of the MQW structure is reduced from 2.5 μm of Comparative Example B1 to 1.75 μm which is 70% of the original total thickness. This reduction in the total thickness greatly reduces the rate at which holes disappear during moving in the MQW structure, and increases, by about 1.43 times, the electric field that accelerates holes and electrons with the same bias voltage. This means that the responsivity of the photodiode is improved over the entire wavelength region. In particular, light on the short wavelength side is likely to be absorbed at the entrance (end position) of the MQW structure, and therefore, is likely to be influenced by the total thickness. By reducing the total thickness as described above, the responsivity on the short wavelength side, which has been lower than the responsivity on the long wavelength side, can be improved to the same level as that on the long wavelength side.

Example 2

Influence of MQW Total Thickness on Responsivity

Figure 9:
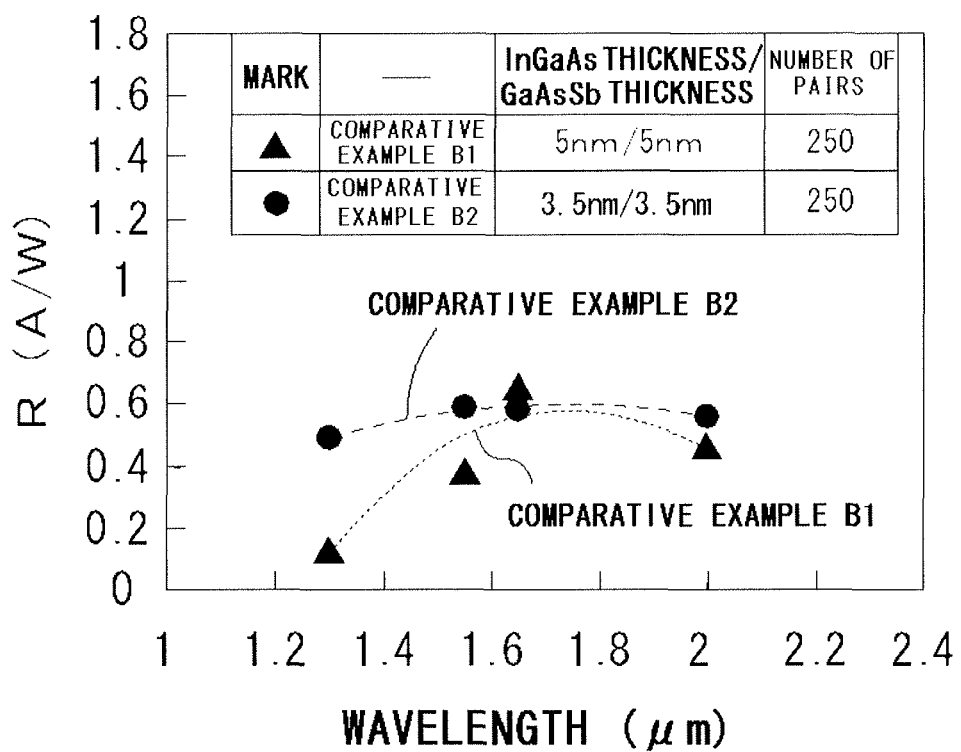
FIG. 9 is a diagram illustrating influences of total MQW thickness and wavelength on responsivity R of each sample in Example 2 (measurement result).

Using the samples of Comparative Examples B1 and B2 of Example 1, the influence of the MQW total thickness on the responsivity was verified. The responsivity was measured at room temperature (25° C.), and a reverse bias voltage of −1 V. The incident surface is the rear surface of the InP substrate. FIG. 9 shows the wavelength dependences of responsivity in Comparative Example B1 (total thickness: 2.5 μm), and Comparative Example B2 (total thickness: 1.75 μm). The wavelength range is limited to 2 μm and lower in which the both examples can be compared.

According to FIG. 9, when the total thickness of the MQW structure increases from 1.75 μm (Comparative Example B2) to 2.5 μm (Comparative Example B1), reduction of the responsivity R is about 0.1 (A/W) at a wavelength of about 2 μm, but the responsivity is significantly degraded at a shorter wavelength, for example, about 1.5 μm. This is because light on the short wavelength side is likely to be absorbed at an end of the MQW structure as soon as it enters the MQW structure from the InP substrate side. Holes generated in this position cannot reach the p-side electrode unless moving through almost the entire thickness of the MQW structure. Therefore, it is considered that the influence of the MQW total thickness remarkably appears on the short wavelength side. In Comparative Example B2 in which the MQW total thickness is 1.75 μm, the responsivity is almost flat in the wavelength range from 1.3 μm to 2.0 μm.

The following was verified by the above Examples 1 and 2. By reducing the thickness of one (e.g., a GaAsSb layer) of two compound semiconductor layers constituting an MQW structure, which layer has a higher valence band potential while maintaining the thickness of the other layer (e.g., an InGaAs layer) as conventional, the limit of absorbable wavelength on the long wavelength side remains almost unchanged. On that basis, the total thickness of the MQW structure is reduced with the reduction in the thickness of the GaAsSb layer. Therefore, it is possible to improve the responsivity over the entire wavelength region. In particular, it is possible to improve the responsivity on the short wavelength side, which is lower than that on the long wavelength side, up to the same responsivity level as on the long wavelength side.

Embodiments of the present invention have been described above. However, the embodiments of the present invention disclosed above are only illustrative, and the scope of the present invention is not limited to the specific embodiments of the invention. It is to be understood that the scope of the present invention is defined in the appended claims and includes equivalence of the description of the claims and all changes within the scope of the claims.

INDUSTRIAL APPLICABILITY

According to the photodiode of the present invention, it is possible to avoid degradation of responsivity particularly on the short wavelength side, while improving the responsivity over the entire wavelength region, without greatly affecting the limit of absorbable wavelength by using a type II MQW structure. As a result, the wavelength dependence of responsivity becomes relatively flat, and thereby it is possible to perform accurate analysis on substances (e.g., water) having a plurality of absorption spectra, or materials or phenomena having a broad absorption band, over a wide wavelength range of the near infrared.

The invention claimed is:

1. A photodiode which is formed on a group III-V compound semiconductor substrate, and includes a pixel, the photodiode comprising:
   an absorption layer which is located on the substrate, and has a type II multiple quantum well (MQW) structure, wherein
   the MQW structure includes fifty or more pairs of two different types of group III-V compound semiconductor layers, and
   a thickness of one of the two different types of group III-V compound semiconductor layers, which layer has a higher potential of a valence band than the other layer, is thinner than a thickness of the other layer,
   wherein the MQW structure is a type II MQW structure composed of pairs of $In_xGa_{1-x}As$ ($0.38 \leq x \leq 0.68$) and $GaAs_ySb_{1-y}$ ($0.36 \leq y \leq 0.62$), and the photodiode further comprising:
   a non-doped diffusive-concentration-distribution-adjusting layer located on the absorption layer, and
   a cap layer located on the non-doped diffusive-concentration-distribution-adjusting layer,
   wherein an oxygen concentration and a carbon concentration are both lower than $1 \times 10^{17}$ cm$^{-3}$ at an interface between the non-doped diffusive-concentration-distribution-adjusting layer and the cap layer.

2. The photodiode according to claim 1, wherein the thickness of the layer having the higher potential of the valence band is 1 nm or more thinner than the thickness of the other layer.

3. The photodiode according to claim 1,
   wherein
   a region of the pixel in the cap layer has p-type conductivity, and a rear surface of the substrate is a light incident surface.

4. The photodiode according to claim 1,
   wherein
   a region of the pixel in the cap layer has n-type conductivity, and light is incident on the cap layer.

5. The photodiode according to claim 1, wherein the substrate is an InP substrate.

6. The photodiode according to claim 1, wherein a responsivity of the photodiode to light having a wavelength of 1500 nm is 0.5 A/W or more.

7. An optical sensor device adopting a photodiode according to claim 1.

8. A method of manufacturing a photodiode which is formed on a group III-V compound semiconductor substrate, and includes a pixel, the method comprising:
   a step of growing an absorption layer of a type II multiple quantum well (MQW) structure, on the substrate, wherein
   in the type II MQW structure, a first group III-V compound semiconductor layer and a second group III-V compound semiconductor layer are paired, and a potential of a valence band of the first group III-V compound semiconductor layer is higher than a potential of a valence band of the second group III-V compound semiconductor layer, and
   in the MQW growing step, a thickness of the first group III-V compound semiconductor layer is made thinner than a thickness of the second group III-V compound semiconductor layer, and fifty or more pairs of the first and second group III-V compound semiconductor layers are deposited,
   wherein the MQW structure is a type II MQW structure composed of pairs of $In_xGa_{1-x}As$ ($0.38 \leq x \leq 0.68$) and $GaAs_ySb_{1-y}$ ($0.36 \leq y \leq 0.62$), and the method further comprising:
   a step of forming a non-doped diffusive-concentration-distribution-adjusting layer including group III-V compound semiconductors after the MQW growing step, and
   a step of forming a cap layer including group III-V compound semiconductors after the step of forming the non-doped diffusive-concentration-distribution-adjusting layer,
   wherein growth is performed in a growth chamber by all metal-organic source MOVPE, from the start of the growth of the MQW structure to the end of the growth of the cap layer, so that an oxygen concentration and a carbon concentration are both lower than $1 \times 10^{17}$ cm$^{-3}$ at an interface formed between the step of forming the non-doped diffusive-concentration-distribution-adjusting layer and the step of forming the cap layer.

9. The method of manufacturing a photodiode according to claim 8, wherein the thickness of the first group compound semiconductor layer is 1 nm or more thinner than the thickness of the second group III-V compound semiconductor layer.

10. The method of manufacturing a photodiode according to claim 8,
    wherein
    a region of the pixel in the cap layer has p-type conductivity, and a rear surface of the substrate is a light incident surface.

11. The method of manufacturing a photodiode according to claim 8,
    wherein
    a region of the pixel in the cap layer has n-type conductivity, and light is incident on the cap layer.

12. The method of manufacturing a photodiode according to claim 8, wherein the substrate is an InP substrate.

* * * * *